(12) United States Patent
Lim et al.

(10) Patent No.: US 7,902,628 B2
(45) Date of Patent: Mar. 8, 2011

(54) SEMICONDUCTOR DEVICE WITH TRENCH ISOLATION STRUCTURE

(75) Inventors: Jae-Eun Lim, Ichon-shi (KR); Sun-Hwan Hwang, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/419,102

(22) Filed: Apr. 6, 2009

(65) Prior Publication Data

US 2009/0189243 A1    Jul. 30, 2009

Related U.S. Application Data

(62) Division of application No. 10/927,668, filed on Aug. 27, 2004, now Pat. No. 7,528,052.

(30) Foreign Application Priority Data

Nov. 28, 2003  (KR) .................. 10-2003-0085701

(51) Int. Cl.
*H01L 21/76* (2006.01)

(52) U.S. Cl. ............. 257/506; 438/435; 257/E21.546

(58) Field of Classification Search .......... 257/506, 257/E21.546; 438/435
See application file for complete search history.

(56) References Cited

U.S. PATENT DOCUMENTS

| 5,940,717 | A | 8/1999 | Rengarajan et al. |
| 6,027,977 | A | 2/2000 | Mogami ............... 438/287 |
| 6,046,487 | A * | 4/2000 | Benedict et al. ......... 257/510 |
| 6,048,775 | A | 4/2000 | Yao et al. |
| 6,074,927 | A | 6/2000 | Kepler et al. .......... 438/400 |
| 6,248,645 | B1 | 6/2001 | Matsuoka et al. |
| 6,277,709 | B1 | 8/2001 | Wang et al. |
| 6,297,106 | B1 | 10/2001 | Pan et al. ................ 438/287 |
| 6,300,219 | B1 | 10/2001 | Doan et al. |
| 6,339,004 | B1 | 1/2002 | Kim ........................ 438/296 |
| 6,444,541 | B1 | 9/2002 | Lai et al. |
| 6,596,607 | B2 | 7/2003 | Ahn |
| 2002/0070430 | A1* | 6/2002 | Oh et al. .............. 257/622 |
| 2002/0093041 | A1 | 7/2002 | Hong .................... 257/301 |
| 2003/0067051 | A1* | 4/2003 | Tamura ................. 257/510 |
| 2003/0209760 | A1 | 11/2003 | Maruyama ............. 257/347 |
| 2004/0132263 | A1* | 7/2004 | Lee ....................... 438/430 |

FOREIGN PATENT DOCUMENTS

| CN | 1400648 | 3/2003 |
| KR | 2002-0055196 | 7/2002 |
| KR | 1020030052663 A | 6/2003 |
| KR | 2003-0059450 | 7/2003 |

OTHER PUBLICATIONS

Wolf, S. "Silicon Processing for the VLSI Era: Process Technology," vol. 1, 1986, pp. 191-194.
Kriegler, R. "The Effect of HCl and Cl2 on the Thermal Oxidation of Silicon," J. Electrochem. Soc., vol. 119, Issue 3, pp. 388-392, Mar. 1972.
Wolf, S. "Silicon Processing for the VLSI Era: Process Technology," vol. 1, 1986, pp. 191-194. * cited by examiner

*Primary Examiner* — Steven J Fulk
(74) *Attorney, Agent, or Firm* — Blakely, Sokoloff, Taylor & Zafman LLP

(57) ABSTRACT

The present invention relates to a semiconductor device with a device isolation structure and a method for fabricating the same. The semiconductor device includes: a substrate provided with a trench formed in the substrate; and at least one device isolation structure including an oxide layer formed on the trench, a nitride layer formed on the oxide layer disposed on sidewalls of the trench and a high density plasma oxide layer formed on the nitride layer to fill the trench.

4 Claims, 6 Drawing Sheets

CELL REGION | PERIPHERAL REGION

CELL REGION | PERIPHERAL REGION

SEMICONDUCTOR DEVICE WITH TRENCH ISOLATION STRUCTURE

The present patent application is a Divisional of application Ser. No. 10/927,668, filed Aug. 27, 2004, now U.S. Pat. No. 7,528,052.

FIELD OF THE INVENTION

The present invention relates to a semiconductor device; and, more particularly, to a semiconductor device with a trench isolation structure and a method for fabricating the same.

DESCRIPTION OF RELATED ARTS

A continuous progression in effects of high-speed and large-scale of integration of semiconductor devices has been made along with advancement in semiconductor technologies. Thus, it is highly necessitated to attain an effect on micronization of relevant patterns with a great precision in their size. These requirements are also applied to device isolation regions relatively occupy wide areas in a semiconductor device.

An oxide layer formed by employing a local oxidation of silicon (LOCOS) method is commonly used as a device isolation layer. However, the LOCOS method has disadvantages that the oxide layer is formed in a wide area and a bird's beak phenomenon occurs at an interfacial surface between the oxide layer and the silicon substrate. Because of the bird's beak phenomenon, an area of an active region becomes decreased, resulting in generation of leakage currents.

As a result, a shallow trench isolation (STI) method which forms a shallow trench but excellently isolates devices has been employed instead of the LOCOS method. Such STI structure formed in a semiconductor device will be described in more detail.

FIGS. 1A and 1B are cross-sectional views for describing a conventional method for fabricating a semiconductor device with a STI structure.

Referring to FIG. 1A, a multi-layered pad 12 for exposing a device isolation region is formed on a substrate 11 divided into a cell region and a peripheral region. At this time, the multi-layered pad 12 can be formed by stacking a pad oxide layer 12A and a pad nitride layer 12B.

Next, an exposed portion of the substrate 11 is etched to a predetermined depth by using the multi-layered pad 12 as an etch mask, so that a trench 13 is formed within the substrate 11. A dry etching process using a plasma gas is employed for the above etching to form the trench 13. However, the dry etching process can induce damages and defects in lattices of silicon on sidewalls of the trench 13. To reduce occurrences of these damages and defects, a first oxide layer 14 is formed by performing a thermal process to the sidewalls of the trench 13.

Subsequent to the formation of the first oxide layer 14, a nitride layer 15 and a second oxide layer 16 are formed on the multi-layered pad 12 and the first oxide layer 14. Thereafter, an insulation layer such as a high density plasma (HDP) oxide layer 17 is deposited in a manner to sufficiently fill the trench 13. Then, the nitride layer 15, the second oxide layer 16 and the HDP oxide layer 17 are subjected to a chemical mechanical polishing (CMP) process which continues until a surface of the multi-layered pad 12 is exposed. After the CMP process, the HDP oxide layer 17 is filled into the trench 13, thereby obtaining a first device isolation structure 100 and a second device isolation structure 101 in the cell region and the peripheral region, respectively. Herein, the first and the second device isolation structures 100 and 101 are STI structures.

Referring to FIG. 1B, another etching process is performed to remove a difference in heights between the first device isolation structure 100 and the second device isolation structure 101. Then, the multi-layered pad 12 is removed. In more detail, a wet etching process proceeds by using phosphoric acid ($H_3PO_4$) to remove the pad nitride layer 12B. Then, another wet etching process proceeds to remove the remaining pad oxide layer 12A by using one of fluoric acid (HF) and buffered oxide etchant (BOE).

In both of the cell region and the peripheral region, the nitride layer 15 serves to protect the sidewalls of the trench 13 and a bottom surface of the substrate 11. Also, the nitride layer 15 reduces a stress induced to the substrate 11 and prevents dopants from diffusing into the substrate 11 from the first and the second device isolation structures 100 and 101. As a result of these effects, it is possible to make an improvement on a refresh characteristic.

Recently, in a semiconductor technology under the design rule of about 80 nm, a designated space for a device isolation layer has been gradually decreased to about 0.12 μm, resulting in a decrease in a gap-fill margin.

In order to overcome the limitation in the gap-fill margin, it is necessary to develop a proper process for the HDP oxide layer 17 and decrease thicknesses of the first oxide layer 14, the nitride layer 15 and the second oxide layer 16. However, a decrease in the thickness of the first oxide layer 14 brings out another adverse effect of degrading characteristics of a P-channel metal oxide semiconductor (PMOS) device formed in the peripheral region.

FIG. 2 is an enlarged diagram showing a path of leakage currents in a PMOS device formed in the vicinity of a device isolation structure. Herein, the same reference numbers are used for the same constitution elements shown in FIGS. 1A to 1B.

As shown, since hot carriers of a transistor have high energy, they are ready to penetrate into a device isolation structure 101 through a first oxide layer 14. Herein, most of the hot carriers penetrating into the device isolation structure 101 are negatively charged electrons which are easily trapped in an interface between a nitride layer 15 and the first oxide layer 14. At this time, since the first oxide layer 14 is formed with a very thin thickness, those negatively charged electrons are trapped more densely. However, if the negatively charged electrons are concentrated in edge areas of the device isolation structure 101, positively charged electrons originated from a substrate 11 in which transistors are formed are positioned around outer surfaces of the device isolation structure 101. At this time, since the negatively charged ions are trapped very densely in the interface between the nitride layer 15 and the first oxide layer 14, more of the positively charged electrons are also attracted.

Therefore, the densely positioned positively charged electrons serve as a current path for connecting $P^+$ junction regions isolated by the device isolation structure 101. Hence, even if the device isolation is achieved by the device isolation structure 101, such leakage currents as a standby current and a self-refresh current are created in between neighboring transistors. These leakage currents become a cause for degrading transistors of the PMOS device. Especially, there may be a problem of a decreased break down voltage of the device isolation structure in the PMOS device.

As the design rule has been shifted towards minimization, portions of the oxide layers disposed at a bottom of a trench become thinner. This thinner thickness accelerates the decrease in the break down voltage of the device isolation structure. If the target thicknesses of the lateral oxide layer are increased to overcome this limitation, the thicknesses of lateral portions of the trench are conversely increased, resulting in a decrease in a gap-fill margin. Also, in case that the nitride layer is removed to secure a sufficient gap-fill margin, it is possible to induce degradation of a refresh characteristic in a cell region. Thus, the removal of the nitride layer may not be possible to obtain the refresh characteristic.

SUMMARY OF THE INVENTION

It is, therefore, an object of the present invention to provide a semiconductor device capable of forming a thin oxide layer and simultaneously preventing a decrease in a break down voltage of a device isolation layer in a P-channel metal oxide semiconductor (PMOS) device caused by the thin oxide layer and a method for fabricating the same.

In accordance with an aspect of the present invention, there is provided a semiconductor device, including: a substrate provided with a trench formed in the substrate; and at least one device isolation structure including an oxide layer formed on the trench, a nitride layer formed on the oxide layer disposed on sidewalls of the trench and a high density plasma oxide layer formed on the nitride layer to fill the trench.

In accordance with another aspect of the present invention, there is also provided a method for fabricating a semiconductor device, including the steps of: forming a trench by etching a substrate to a predetermined depth; forming an oxide layer on the trench; forming a nitride layer on the oxide layer; removing the nitride layer disposed on a bottom of the trench; filling a high density plasma oxide layer into the trench; and planarizing the high density plasma oxide layer, thereby obtaining at least one device isolation structure in the semiconductor device.

In accordance with still another aspect of the present invention, there is provided a semiconductor device, including: a substrate provided with a trench formed in the substrate; and at least one device isolation structure including an oxide layer formed on sides and a bottom of the trench, a nitride layer formed on the oxide layer, an oxynitride layer formed on the oxide layer disposed at the bottom of the trench, and a high density plasma oxide layer formed on the nitride layer and the oxynitride layer to fill the trench.

In accordance with further aspect of the present invention, there is provided a method for fabricating a semiconductor device, including the steps of: forming a trench by etching a substrate to a predetermined depth; forming an oxide layer on the trench; forming a nitride layer on the oxide layer; oxidizing a bottom portion of the nitride layer; filling a high density plasma oxide layer into the trench; and planarizing the high density plasma oxide layer, thereby obtaining at least one device isolation structure in the semiconductor device.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, a semiconductor device with a trench isolation structure and a method for fabricating the same in accordance with preferred embodiments of the present invention will be described in more detail with reference to the accompanying drawings.

Figure 1A:
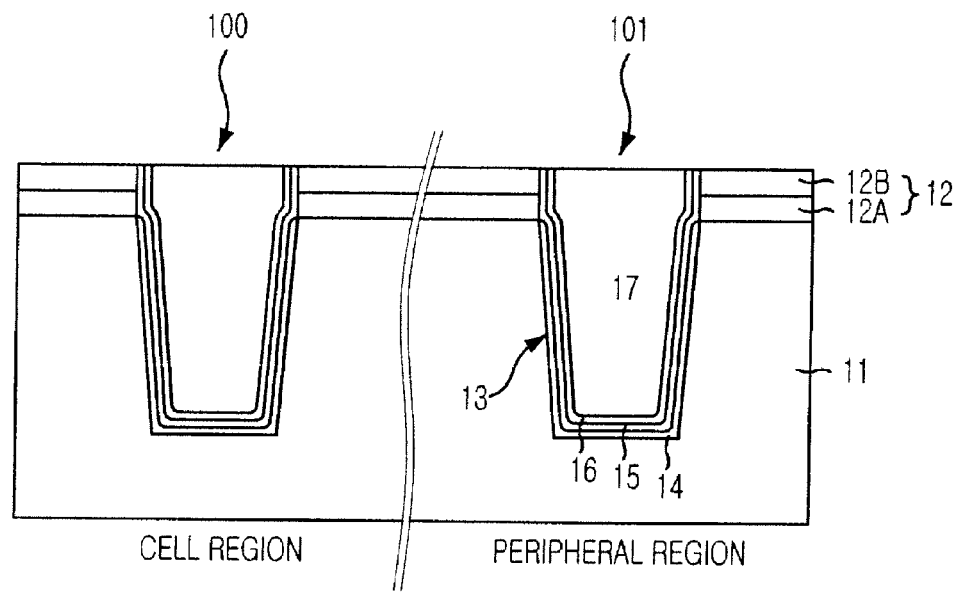
FIGS. 1A and 1B are cross-sectional views setting forth a conventional method for fabricating a semiconductor device with a shallow trench isolation structure.
Figure 1B:
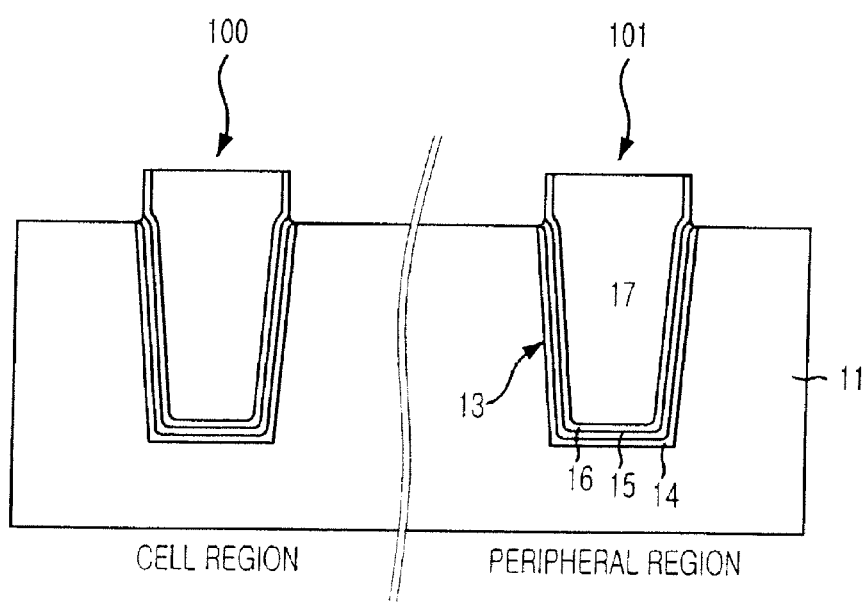
Figure 2:
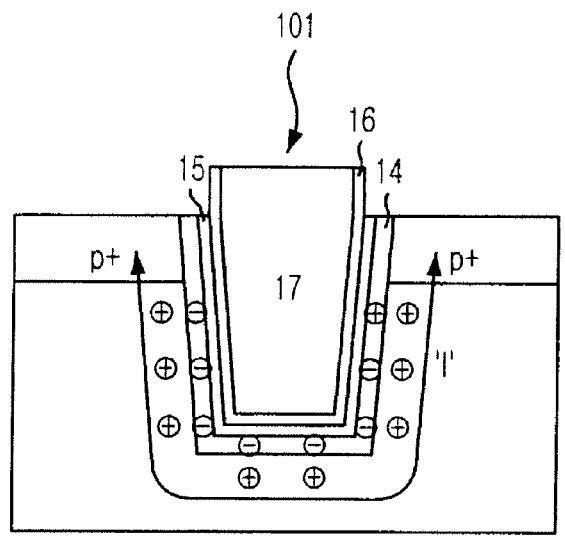
FIG. 2 is an enlarged diagram showing a path of leakage currents in a P-channel metal oxide semiconductor device in the vicinity of a conventionally formed device isolation structure.
Figure 3:
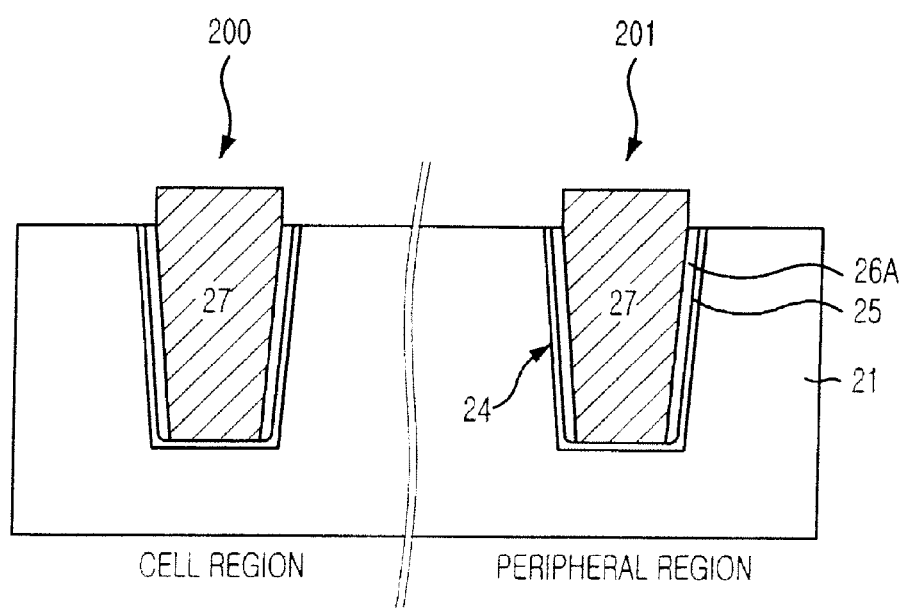
FIG. 3 is a cross-sectional view representing a semiconductor device with a STI structure in accordance with a preferred embodiment of the present invention.

FIG. 3 is a cross-sectional view of a semiconductor device having a shallow trench isolation (STI) structure in accordance with a preferred embodiment of the present invention.

As shown, a substrate 21 is classified into a cell region in which memory devices are formed and a peripheral region in which circuit devices are formed. A first device isolation structure 200 and a second device isolation structure 201 both for isolating devices in the cell region and the peripheral region, respectively are formed in the substrate 21.

More specifically, each of the first device isolation structure 200 and the second device isolation structure 201 includes an oxide layer 25 formed on inner surfaces of a trench 24 formed in a portion of the substrate 21 disposed between adjacent transistors, a nitride layer 26A formed on sidewalls of the oxide layer 25 and a high density plasma oxide (HDP) layer 27 filled into the trench 24.

Herein, the oxide layer 25 is formed for eliminating damages generated by an etching process for forming the trench 24 and has a thickness ranging from approximately 20 Å to approximately 50 Å. Also, the nitride layer 26A serves as a buffer layer for buffering a stress created by a difference in thermal expansion coefficients between the substrate 21 made of silicon and the high plasma density oxide layer 27 and as a barrier layer for blocking defects generated in an active region from extending towards inside of the trench 24. The nitride layer 26A can be made of silicon nitride such as $Si_3N_4$ and has a thickness ranging from approximately 50 Å to approximately 100 Å.

According to the preferred embodiment of the present invention, the nitride layer 26A included in each of the first device isolation structure 200 and the second device isolation structure 201 is not formed on the bottom surface of the trench 24 but only on the sidewalls of the trench 24. As a result of this selective formation of the nitride layer 26A, it is possible to improve a refresh characteristic in the cell region since the bottom surface of the trench 24 in the cell region is not affected by leakage currents created between a junction region and a device isolation structure. Also, the selective formation of the nitride layer 26A in the peripheral region makes it possible to prevent a decrease in a break down voltage of the device isolation structure 201 in a P-channel metal oxide semiconductor (PMOS) device caused by trapped charges in an interface between the oxide layer 25 and the nitride layer 26A. That is, since the nitride layer 26A is not formed at the bottom surface of the trench 24, leakage currents can pass through the device isolation structures 200 and 201.

FIGS. 4A to 4D are cross-sectional views for describing a method for fabricating the semiconductor device as shown in FIG. 3.

Figure 4A:
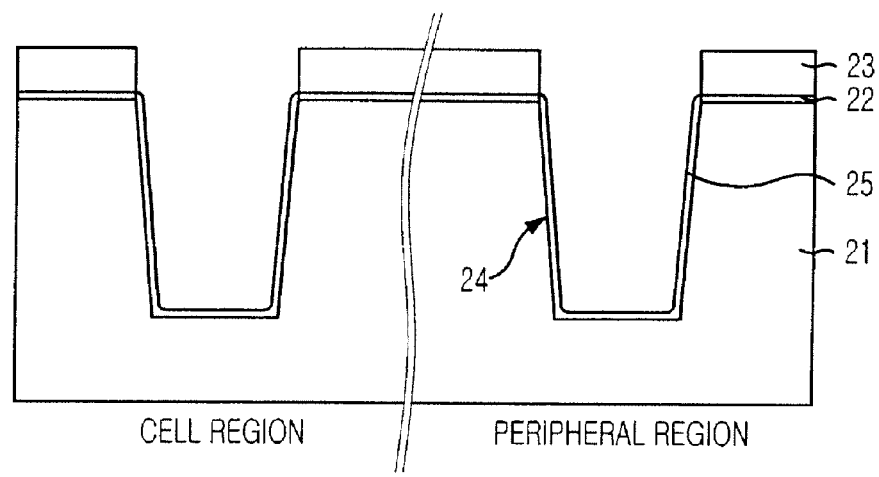
FIGS. 4A to 4D are cross-sectional views describing a method for fabricating the semiconductor device shown in FIG. 3.

Referring to FIG. 4A, a semi-finished substrate structure is prepared. The semi-finished substrate structure includes a substrate 21 provided with shallow trenches 24, a patterned pad nitride layer 23, a patterned pad oxide layer 22, and an oxide layer 25. Herein, the oxide layer 25 is formed on the shallow trench 24, and the patterned pad oxide layer 22 and the patterned pad nitride layer 23 are formed on top portions of the substrate 21 which does not form the trench 24.

More detailed descriptions on the preparation of the semi-finished substrate structure will be provided hereinafter.

First, the substrate 21 is a silicon substrate containing a predetermined amount of an impurity and is classified into a cell region and a peripheral region.

In each of the cell region and the peripheral region, a pad oxide layer 22 and a pad nitride layer 23 are sequentially formed on the substrate 21 by a photolithography process proceeding under a target that designated device isolation regions of the substrate 21 is exposed. From this photolithography process, the patterned pad nitride layer 23 and the patterned pad oxide layer 22 are obtained. Also, the patterned pad oxide layer 22 has a thickness ranging from approximately 50 Å to approximately 150 Å, while the patterned pad nitride layer 23 has a thickness ranging from approximately 1,000 Å to approximately 2,000 Å. Also, the individual designated device isolation region defines the cell region and the peripheral region and serves to isolate devices in each region.

Next, in each of the cell region and the peripheral region, the trench 24 is formed by etching an exposed portion of the substrate 21 to a depth ranging from approximately 1,000 Å to approximately 1,500 Å by using the patterned pad nitride layer 23 as an etch mask. Herein, the trench 24 is a shallow trench for isolating devices in each of the cell region and the peripheral region. Compared to the trench 24 formed in the peripheral region, the trench 24 formed in the cell region has a narrower width since devices are formed more densely in the cell region. The etching process for forming the trench 24 in each of the cell region and the peripheral region can employ a dry etching process using a plasma. However, this dry etching process might adversely bring out damages and defects in silicon lattices which possibly become sources for inducing leakage currents.

In each of the cell region and the peripheral region, the oxide layer 25 for curing damages and defects in silicon lattices generated inside of the trench 24 is subsequently formed on inner surfaces of the trench 24 by performing a thermal process to sidewalls of the trench 24. At this time, the oxide layer 25 has a thickness relatively thin in consideration of a gap-fill margin but sufficiently thick enough to maintain an interface characteristic between silicon (Si) and silicon dioxide ($SiO_2$). The reason for this specifically decided thickness is to minimize the number of trap sites formed within the interface between the silicon and the silicon oxide. Preferably, the oxide layer 25 has a thickness ranging from approximately 10 Å to approximately 100 Å.

In case of adopting a furnace oxidation process for forming the oxide layer 25, the furnace oxidation process proceeds at a temperature ranging from approximately 750° C. to approximately 900° C. In case of adopting a low temperature plasma/radical oxidation process, a preferable temperature ranges from approximately 200° C. to approximately 600° C.

As described above, the oxide layer 25 in each of the cell region and the peripheral region is formed by performing a dry oxidation process providing less interface traps. For instance, in order to minimize the number of interface traps, approximately 5% to approximately 10% of chlorine (Cl) gas is added in the beginning of the dry oxidation process which is subsequently performed at a temperature in a range from about 850° C. to about 950° C. That is, a wet oxidation process generally creates the less number of interface traps due to chemically terminated hydrogens but eventually generates more interface traps due to weak hydrogen bonds easily broken by an externally exerted electric stress. However, the dry oxidation process using the Cl gas has the decreased number of interface traps since the Cl gas molecules are accumulated on the interface between the silicon substrate 21 and the oxide layer 25 to thereby form chloride bonds with the silicon that is much stronger than the hydrogen bonds.

Figure 4B:
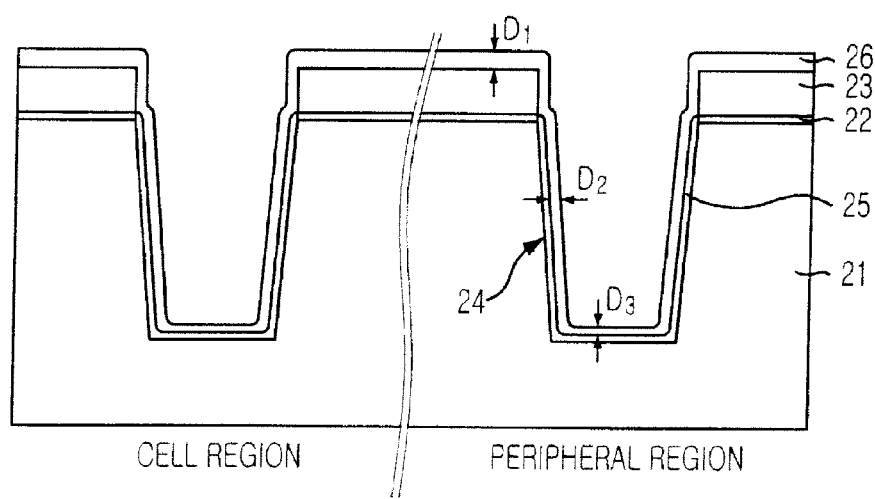

Referring to FIG. 4B, a nitride layer 26 is formed on a substrate structure containing the oxide layer 25 by employing a chemical vapor deposition (CVD) method. Herein, the nitride layer 26 serves as a buffer layer for buffering a stress created by a difference in thermal expansion coefficients between the substrate 21 and a HDP oxide layer which will be filled into the trench 24 in later processes and as a barrier layer for blocking defects generated in an active region from extending towards inside of a device isolation structure. Silicon nitride ($Si_3N_4$) is an exemplary material used for forming the nitride layer 26. Also, the nitride layer has a thickness ranging from approximately 20 Å to approximately 100 Å.

Especially, the nitride layer 26 is deposited with different thicknesses at each different portion of the trench profile. That is, a bottom thickness $D_3$ of the nitride layer 26 deposited on a bottom surface of the trench 24 is thinner than top and lateral thicknesses $D_1$ and $D_2$ of the nitride layer 26 disposed on top and bottom portions of the trench 24 by controlling a step coverage characteristic.

Figure 4C:
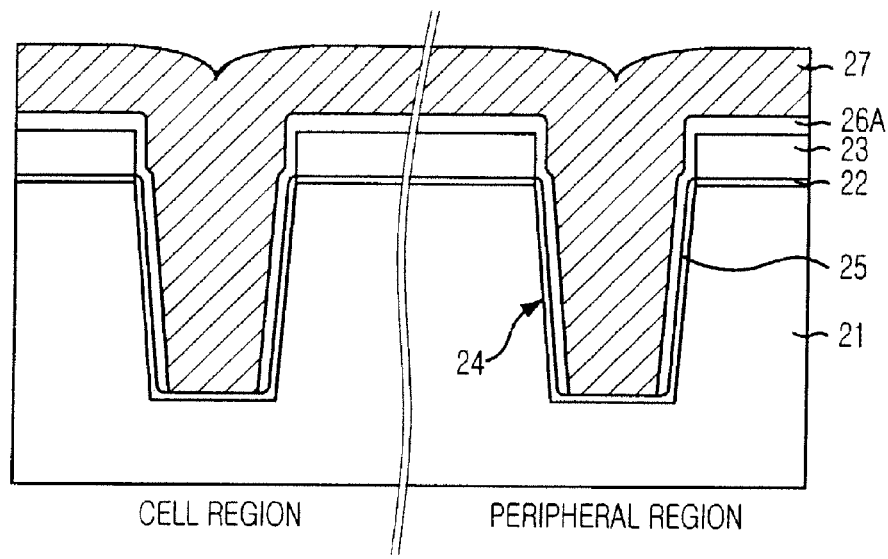

Referring to FIG. 4C, a portion of the nitride layer 26 disposed at a bottom of the trench 24 is removed by using a photoresist pattern (not shown) as a mask. Also, the removal of the bottom portion of the nitride layer 26 prevents formation of charge trapping sites, i.e., an interface between the nitride layer 26 and the oxide layer 25. Herein, a reference numeral 26A denotes a remaining nitride layer after the removal of the bottom portion of the nitride layer 26.

Then, the aforementioned HDP oxide layer 27 is formed on the above resulting substrate structure with a thickness that allows the trench 24 to be sufficiently filled. The thickness of the HDP oxide layer 27 ranges from approximately 6,000 Å to approximately 10,000 Å. At this time, the HDP oxide layer 27 is deposited by employing a plasma deposition method using a source of silicon and oxygen plasma, preferably, a plasma enhanced CVD method.

Figure 4D:
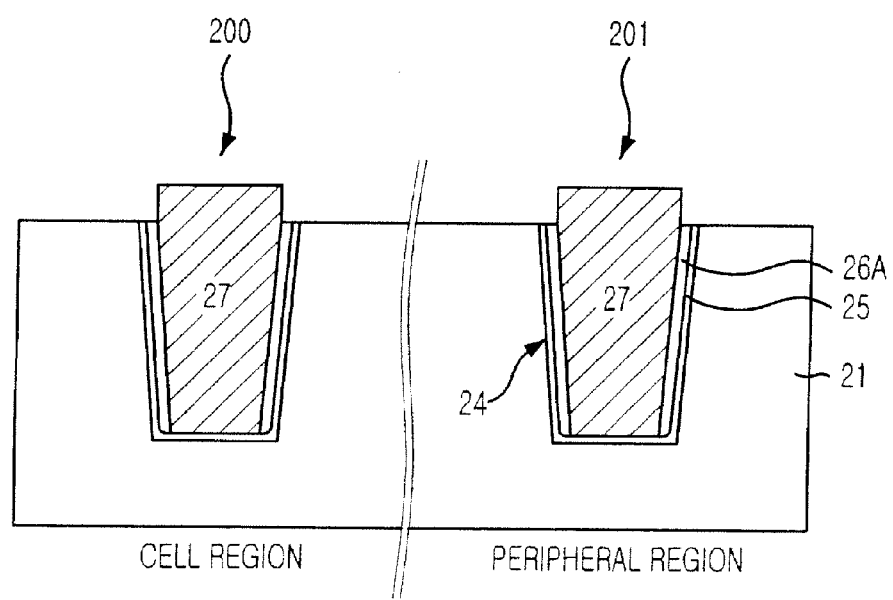

Referring to FIG. 4D, the HDP oxide layer 27 is subjected to a chemical mechanical polishing (CMP) process which continues until a surface of the patterned pad nitride layer 23 is exposed. After the CMP process, the high plasma density plasma oxide layer 27 becomes filled into the trench 24, thereby forming a first device isolation structure 200 and a second device isolation structure 201 in the cell region and the peripheral region, respectively.

Subsequently, an additional etching process for eliminating a difference in heights between the first device isolation structure 200 and the second device isolation structure 201 proceeds. Thereafter, a cleaning process is performed to remove the patterned pad nitride layer 23 by using phosphoric acid ($H_3PO_4$). Another cleaning process is also performed to remove the patterned pad oxide layer 22 by using one of fluoric acid (HF) and buffered oxide etchant (BOE).

FIGS. 5A to 5D are cross-sectional views for describing a method for fabricating a semiconductor device in accordance with another preferred embodiment of the present invention.

Figure 5A:
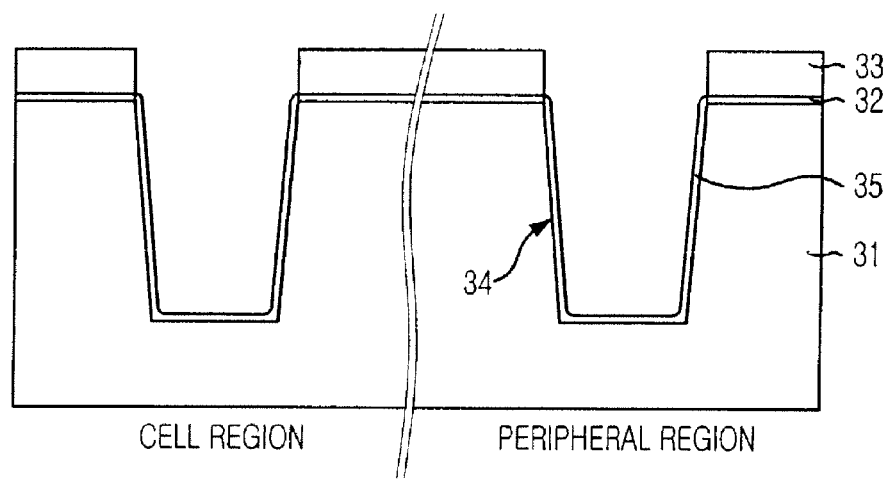
FIGS. 5A to 5D are cross-sectional views describing a method for fabricating a semiconductor device in accordance with another preferred embodiment of the present invention.

Referring to FIG. 5A, a semi-finished substrate structure is prepared. The semi-finished substrate structure includes a substrate 31 provided with shallow trenches 34, a patterned pad nitride layer 33, a patterned pad oxide layer 32, and an oxide layer 35. Herein, the oxide layer 35 is formed on the shallow trench 34, and the patterned pad oxide layer 32 and the patterned pad nitride layer 33 are formed on top portions of the substrate 31 which does not form the trench 34.

More detailed descriptions on the preparation of the semi-finished substrate structure will be provided hereinafter.

First, the substrate 31 is a silicon substrate containing a predetermined amount of an impurity and is classified into a cell region and a peripheral region.

In each of the cell region and the peripheral region, a pad oxide layer 32 and a pad nitride layer 33 are sequentially formed on the substrate 31 by a photolithography process proceeding under a target that designated device isolation regions of the substrate 31 is exposed. From this photolithography process, the patterned pad nitride layer 33 and the patterned pad oxide layer 32 are obtained. Also, the patterned pad oxide layer 32 has a thickness ranging from approximately 50 Å to approximately 150 Å, while the patterned pad nitride layer 33 has a thickness ranging from approximately 1,000 Å to approximately 2,000 Å. Also, the individual designated device isolation region defines the cell region and the peripheral region and serves to isolate devices in each region.

Next, in each of the cell region and the peripheral region, the trench 34 is formed by etching an exposed portion of the substrate 31 to a depth ranging from approximately 1,000 Å to approximately 1,500 Å by using the patterned pad nitride layer 33 as an etch mask. Herein, the trench 34 is a shallow trench for isolating devices in each of the cell region and the peripheral region. Compared to the trench 34 formed in the peripheral region, the trench 34 formed in the cell region has a narrower width since devices are formed more densely in the cell region. The etching process for forming the trench 34 in each of the cell region and the peripheral region can employ a dry etching process using a plasma. However, this dry etching process might adversely bring out damages and defects in silicon lattices which possibly become sources for inducing leakage currents.

In each of the cell region and the peripheral region, the oxide layer 35 for curing damages and defects in silicon lattices generated inside of the trench 34 is subsequently formed on inner surfaces of the trench 34 by performing a thermal process to sidewalls of the trench 34. At this time, the oxide layer 35 has a thickness relatively thin in consideration of a gap-fill margin but sufficiently thick enough to maintain an interface characteristic between silicon (Si) and silicon dioxide ($SiO_2$). The reason for this specifically decided thickness is to minimize the number of trap sites formed within the interface between the silicon and the silicon oxide. Preferably, the oxide layer 35 has a thickness ranging from approximately 10 Å to approximately 100 Å.

In case of adopting a furnace oxidation process for forming the oxide layer 35, the furnace oxidation process proceeds at a temperature ranging from approximately 750° C. to approximately 900° C. In case of adopting a low temperature plasma/radical oxidation process, a preferable temperature ranges from approximately 200° C. to approximately 600° C.

As described above, the oxide layer 35 in each of the cell region and the peripheral region is formed by performing a dry oxidation process providing less interface traps. For instance, in order to minimize the number of interface traps, approximately 5% to approximately 10% of chlorine (Cl) gas is added in the beginning of the dry oxidation process which is subsequently performed at a temperature in a range from about 850° C. to about 950° C. That is, a wet oxidation process generally creates the less number of interface traps due to chemically terminated hydrogens but eventually generates more interface traps due to weak hydrogen bonds easily broken by an externally exerted electric stress. However, the dry oxidation process using the Cl gas has the decreased number of interface traps since the Cl gas molecules are accumulated on the interface between the silicon substrate 31 and the oxide layer 35 to thereby form chloride bonds with the silicon that is much stronger than the hydrogen bonds.

Figure 5B:
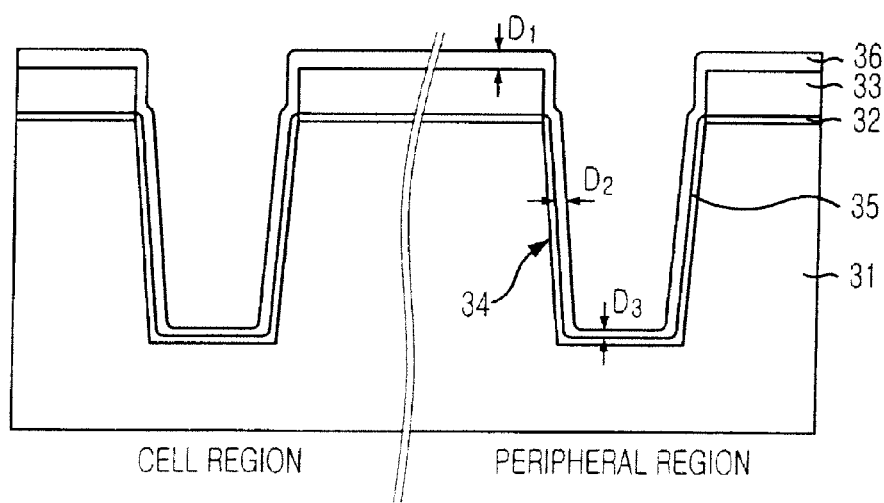

Referring to FIG. 5B, a nitride layer 36 is formed on a substrate structure containing the oxide layer 35 by employing a chemical vapor deposition (CVD) method. Herein, the nitride layer 36 serves as a buffer layer for buffering a stress created by a difference in thermal expansion coefficients between the substrate 31 and a HDP oxide layer which will be filled into the trench 34 in later processes and as a barrier layer for blocking defects generated in an active region from extending towards inside of a device isolation structure. Silicon nitride ($Si_3N_4$) is an exemplary material used for forming the nitride layer 36.

Especially, the nitride layer 36 is deposited with different thicknesses at each different portion of the trench profile. That is, a bottom thickness $D_3$ of the nitride layer 36 deposited on a bottom surface of the trench 34 is thinner than top and lateral thicknesses $D_1$ and $D_2$ of the nitride layer 36 disposed on top and bottom portions of the trench 34 by controlling a step coverage characteristic. Particularly, the bottom thickness $D_3$ is determined by considering a thickness of the nitride layer 36 oxidized in the course of proceeding with the subsequent deposition of the HDP oxide layer.

Figure 5C:
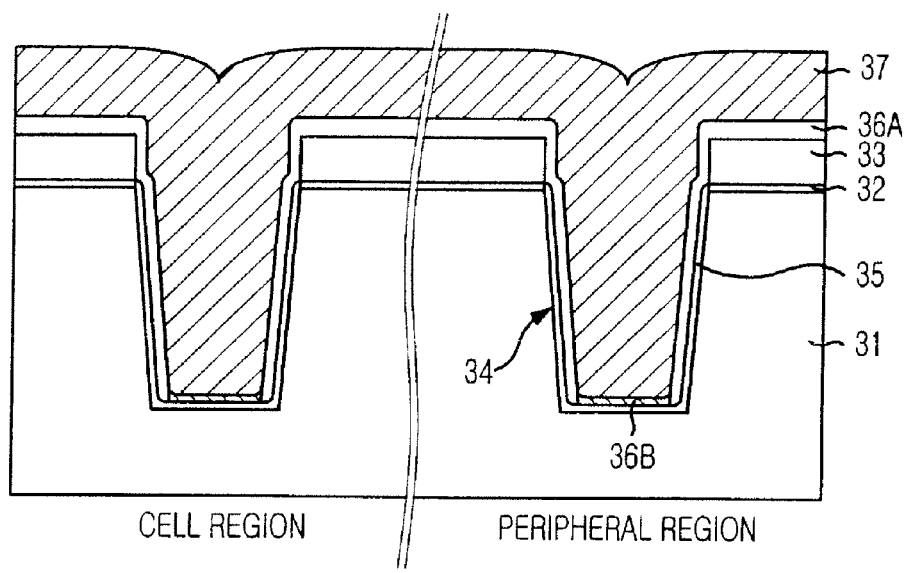

Referring to FIG. 5C, the nitride layer 36 disposed at a bottom of the trench 34 is oxidized by performing a preheating process, thereby obtaining an oxynitride layer 36B and a remaining nitride layer 36A. It is preferable that a thickness of the nitride layer 36 formed on the bottom of the trench 34 ranges from approximately 0 Å to approximately 70 Å.

Also, the oxidization of the nitride layer 36 depends on a flow rate of oxygen ($O_2$) gas, a processing period of the preheating process and a low frequency power that increases an ionization rate within the plasma. Particularly, the preheating process is carried out for approximately 100 seconds to approximately 500 seconds with use of the $O_2$ gas having a flow rate ranging from approximately 100 sccm to approximately 500 sccm and the low frequency power ranging from approximately 2,000 W to approximately 5,000 W. This oxidization of the bottom portion of the nitride layer 26 prevents formation of charge trapping sites, i.e., an interface between the nitride layer 26 and the oxide layer 25.

Then, the aforementioned HDP oxide layer 37 is formed on the above resulting substrate structure with a thickness that allows the trench 34 to be sufficiently filled. The thickness of the HDP oxide layer 37 ranges from approximately 6,000 Å to approximately 10,000 Å. At this time, the HDP oxide layer 37 is deposited by employing a plasma deposition method using a source of silicon and oxygen plasma, preferably, a plasma enhanced CVD method.

Figure 5D:
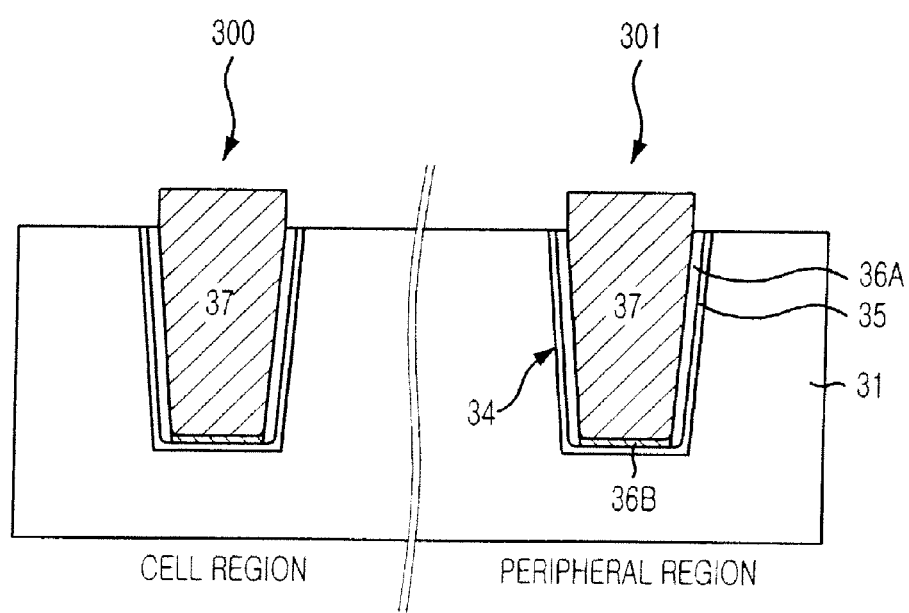

Referring to FIG. 5D, the HDP oxide layer 37 is subjected to a chemical mechanical polishing (CMP) process which continues until a surface of the patterned pad nitride layer 33 is exposed. After the CMP process, the high plasma density plasma oxide layer 37 become filled into the trench 34, thereby forming a first device isolation structure 300 and a second device isolation structure 301 in the cell region and the peripheral region, respectively.

Subsequently, an additional etching process for eliminating a difference in heights between the first device isolation structure 300 and the second device isolation structure 301 proceeds. Thereafter, a cleaning process is performed to remove the patterned pad nitride layer 33 by using phosphoric acid ($H_3PO_4$). Another cleaning process is also performed to remove the patterned pad oxide layer 32 by using one of fluoric acid (HF) and buffered oxide etchant (BOE).

In accordance with the preferred embodiments of the present invention, in the peripheral region, the nitride layer disposed on the bottom surface of the trench is removed or oxidized before the HDP oxide layer is deposited. Thus, even if the nitride layer which traps electrons exists on the sidewalls of the trench, a leakage current path is not formed between junction regions of neighboring transistors since the nitride layer is not formed at the bottom surface of the trench.

Also, in the cell region, the remaining nitride layer disposed on the sidewalls of the trench is essential to obtain a good refresh characteristic. However, it is not critical to remove or oxidize the nitride layer disposed on the bottom surface of the trench since the bottom portion of the nitride layer does not have an effect on the leakage currents between the device isolation structure and the junction region.

Since the interface between the nitride layer and the lateral oxide layer is not created at the bottom portion of the trench by removing the nitride layer disposed on the bottom surface of the trench, or by changing the nitride layer disposed on the bottom surface of the trench into another material, it is possible to decrease the thickness of the lateral oxide layer without reducing a break down voltage of the device isolation structure in the PMOS device, wherein the reduction of the break down voltage is caused by charge traps. As a result of the decreased thickness of the oxide layer, a gap-fill margin for forming the device isolation structure can be secured.

The present application contains subject matter related to the Korean patent application No. KR 2003-0085701, filed in the Korean Patent Office on Nov. 28, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor device, comprising:
   a substrate provided with a trench formed in the substrate; and
   at least one device isolation structure including an oxide layer formed on sidewalls and a bottom of the trench, a nitride layer formed on the oxide layer, an oxynitride layer formed directly on the oxide layer disposed at the bottom of the trench, and a high density plasma oxide layer formed on the nitride layer and the oxynitride layer to fill the trench.

2. The semiconductor device of claim 1, wherein the device isolation structure isolates elements formed in one of a cell region and a peripheral region of the substrate.

3. The semiconductor device of claim 1, wherein the oxynitride layer is confined to a bottom of the trench.

4. The semiconductor device of claim 1, wherein a thickness of the oxynitride layer is less than a thickness of the nitride layer.

\* \* \* \* \*